United States Patent
Jung

(10) Patent No.: US 7,271,637 B2
(45) Date of Patent: Sep. 18, 2007

(54) CIRCUIT AND METHOD OF CONTROLLING A DELAY OF A SEMICONDUCTOR DEVICE

(75) Inventor: Hyun-Taek Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/329,719

(22) Filed: Jan. 11, 2006

(65) Prior Publication Data

US 2006/0158238 A1 Jul. 20, 2006

(30) Foreign Application Priority Data

Jan. 14, 2005 (KR) .................. 10-2005-0003643

(51) Int. Cl.
*H03H 11/26* (2006.01)
(52) U.S. Cl. .............. 327/261; 327/270; 327/272; 327/273
(58) Field of Classification Search ............... 327/261, 327/270–273, 276–279, 281, 158, 161
See application file for complete search history.

(56) References Cited

U.S. PATENT DOCUMENTS

| | | | | |
|---|---|---|---|---|
| 5,900,754 A | * | 5/1999 | Nakatani | 327/158 |
| 6,327,318 B1 | | 12/2001 | Bhullar et al. | 375/374 |
| 6,489,822 B2 | | 12/2002 | Han | 327/158 |
| 7,084,684 B2 | * | 8/2006 | Kim et al. | 327/276 |
| 7,126,400 B2 | * | 10/2006 | Tamura | 327/261 |
| 2002/0186064 A1 | * | 12/2002 | Ooishi | 327/278 |
| 2003/0001650 A1 | * | 1/2003 | Cao et al. | 327/277 |
| 2005/0253640 A1 | * | 11/2005 | Kim | 327/218 |

FOREIGN PATENT DOCUMENTS

| | | |
|---|---|---|
| JP | 10-224333 | 8/1998 |
| JP | 2000-174594 | 6/2000 |

* cited by examiner

*Primary Examiner*—Shuwang Liu
*Assistant Examiner*—Patrick O'Neill
(74) *Attorney, Agent, or Firm*—F. Chau & Assoc., LLC

(57) ABSTRACT

A delay control circuit capable of controlling a delay time is disclosed. The delay control circuit includes a delay detecting circuit, a first pulse generator, a counter control circuit and a counter. The delay detecting circuit delays an input signal by a first time in response to an output signal and compares the input signal and the delayed input signal to generate a first signal. The first pulse generator generates a second signal in response to the input signal. The counter control circuit generates a count-up signal and a count-down signal in response to the first signal and the second signal. The counter generates the output signal in response to the count-up signal and the count-down signal to divide the first time by $2^n$ intervals, wherein n is a positive integer.

26 Claims, 15 Drawing Sheets

CIRCUIT AND METHOD OF CONTROLLING A DELAY OF A SEMICONDUCTOR DEVICE

CROSS-REFERENCE TO RELATED APPLICATION

This application claims priority under 35 U.S.C. § 119 to Korean Patent Application No. 2005-3643, filed on Jan. 14, 2005, the disclosure of which is incorporated by reference herein in its entirety.

BACKGROUND OF THE INVENTION

1. Technical Field

The present invention relates to a delay control circuit and a method of controlling a delay of a semiconductor device, and more particularly, to a circuit and a method, which detect and control a delay time in accordance with a change in operating conditions of the semiconductor device.

2. Discussion of the Related Art

A delay time of a delay circuit in a semiconductor device typically changes according to operating conditions affecting the semiconductor device. In particular, operating conditions such as a fabrication process, temperature, and voltage may change of the delay time and thus affect the operation of the semiconductor device.

For example, when the delay time is changed, a design margin may be reduced and the semiconductor device or circuit on which it is embedded may operate abnormally. In other words, a deviation in the delay time due to a fabrication process, temperature or voltage may exert a significant influence on the reliability and stability of the semiconductor device.

For example, if the temperature of the semiconductor device exceeds a certain operating threshold, the delay time may increase and erroneous data may be output therefrom. Similarly, if a supply voltage of the semiconductor device changes, the delay time may vary thus causing unwanted data to be output.

As such a need exists for a delay circuit for use with a semiconductor device that is capable of maintaining a stable delay time in view of operating conditions that may adversely affect the reliability of the semiconductor device.

SUMMARY OF THE INVENTION

According to an embodiment of the present invention, there is provided a delay control circuit including a delay detecting circuit, a first pulse generator, a counter control circuit and a counter.

The delay detecting circuit delays an input signal by a first time in response to an output signal and compares the input signal and the delayed input signal to generate a first signal. The first pulse generator generates a second signal in response to the input signal. The counter control circuit generates a count-up signal and a count-down signal in response to the first signal and the second signal. The counter generates the output signal in response to the count-up signal and the count-down signal to divide the first time by $2^n$ intervals, wherein n is a positive integer.

The delay detecting circuit includes a delay circuit, a comparator and a latch circuit. The delay circuit delays the input signal by the first time to generate the delayed input signal in response to the output signal. The comparator compares the input signal and the delayed input signal. The latch circuit latches an output signal of the comparator.

The delay detecting circuit further includes an inverter for inverting an output of the latch circuit.

The delay circuit includes: $2^n$ delay cells coupled in a cascade form between an input node to which the input signal is applied and an output node to which the delayed input signal is outputted; and $2^n$ switches coupled between the input node and the output node and between input and output nodes of corresponding delay cells, wherein the switches are switched in response to the output signal.

Each of the delay cells includes: a plurality of inverters connected in a cascade form; PMOS capacitors coupled between an output terminal of each of the inverters and a first supply voltage; and NMOS capacitors coupled between the output terminal of each of the inverters and a second supply voltage.

The comparator includes: an AND gate for performing a logical AND operation on the input signal and the delayed input signal; and a transmission gate for transmitting an output signal of the AND gate to a next stage.

The first pulse generator includes: a delay circuit for delaying the input signal by the first time; and an AND gate for performing a logical AND operation on the input signal and the delayed input signal.

The counter control circuit includes: an inverter for inverting the first signal; a first AND gate for performing a logical AND operation on the first signal and the second signal; and a second AND gate for performing the logical AND operation on the second signal and an output signal of the inverter.

The delay control circuit further comprises: a second pulse generator for generating the input signal in response to a clock signal and an enable signal.

The second pulse generator includes: an AND gate for performing a logical AND operation on the clock signal and the enable signal; a pull-up device for pulling up a first node to a level of a first supply voltage; a pull-down device for pulling down the first node to a level of a second supply voltage; and a latch circuit for latching a signal of the first node.

According to another embodiment of the present invention, there is provided a delay control circuit including a delay circuit and a comparing circuit.

The delay circuit generates a plurality of delayed input signals in response to an input signal, each of the delayed input signals having a different delay time. The comparing circuit compares the input signal and each of the delayed input signals to generate a plurality of first signals.

The delay control circuit may further include a converter circuit for converting the first signals into a plurality of second signals.

The delay circuit includes a plurality of delay cells connected in a cascade form, wherein the delayed input signals are output from an output node of each of the delay cells.

Each of the delay cells includes: a plurality of inverters connected in a cascade form; PMOS capacitors coupled between an output terminal of each of the inverters and a first supply voltage; and NMOS capacitors coupled between the output terminal of each of the inverters and a second supply voltage.

The comparing circuit includes a plurality of comparators for comparing a pulse signal having the same phase as the input signal and each of the delayed input signals.

Each of the comparators includes: an AND gate for performing a logical AND operation on the pulse signal and one of the delayed input signals; a first transmission gate for transmitting an output signal of the AND gate to a next stage; a first latch circuit for latching an output signal of the first transmission gate; a second transmission gate for transmitting an output signal of the first latch circuit in response to the pulse signal and a pulse signal having a phase opposite the input signal; and a second latch circuit for latching an output signal of the second transmission gate.

The plurality of delayed input signals is comprised of 8 signals.

The converter circuit includes: a first converter for generating first data in response to a first output signal of the comparing circuit; a second converter for generating second data in response to a second output signal of the comparing circuit and the first data; a third converter for generating third data in response to a third output signal of the comparing circuit and the second data; a fourth converter for generating fourth data in response to a fourth output signal of the comparing circuit and the third data; a fifth converter for generating fifth data in response to a fifth output signal of the comparing circuit and the fourth data; a sixth converter for generating sixth data in response to a sixth output signal of the comparing circuit and the fifth data; a seventh converter for generating seventh data in response to a seventh output signal of the comparing circuit and the sixth data; and an eighth converter for generating eighth data in response to an eighth output signal of the comparing circuit and the seventh data, wherein the plurality of first signals comprises the first to eighth output signals of the comparing circuit and the plurality of second signals comprises the first to eighth data.

The first converter sets the second data to a first value when the first output signal of the comparing circuit has a second value. The first converter includes a resistor.

An n-th (n is a positive integer greater than 1 and less than 8) converter passes an n-th output signal of the comparing circuit to generate n-th data in response to (n−1)-th data.

The n-th converter includes: a transmission gate for transmitting an n-th output signal of the comparing circuit to a first node in response to the (n−1)-th data; a pull-down transistor for pulling down the first node to a level of a low supply voltage; and a latch circuit for latching a signal of the first node.

The delay control circuit further comprises: an inverter for inverting an output signal of the latch circuit.

The eighth converter sets the eighth data to a second value when the eighth output signal of the comparing circuit has a first value.

The eighth converter includes: a first transmission gate for transmitting an eighth output signal of the comparing circuit to a first node in response to the seventh data; a pull-down transistor for pulling down the first node to a level of a low supply voltage in response to the seventh data; a second transmission gate for transmitting a signal of the first node to a second node in response to the eighth output signal of the comparing circuit; a pull-up transistor for pulling up the second node to a level of a high supply voltage in response to the eighth output signal of the comparing circuit; and a first latch circuit for latching a signal of the second node.

The eighth converter further includes an inverter for inverting an output signal of the latch circuit.

The delay control circuit further comprises: a second pulse generator for generating the input signal in response to a clock signal and an enable signal.

According to yet another embodiment of the present invention, there is provided a method of controlling a delay of a semiconductor device. The method includes delaying an input signal by a first time in response to an output signal; comparing the input signal and the delayed input signal to generate a first signal; generating a second signal in response to the input signal; generating a count-up signal and a count-down signal in response to the first signal and the second signal; and generating the output signal in response to the count-up signal and the count-down signal to divide the first time by $2^n$ intervals, wherein n is a positive integer.

According to another embodiment of the present invention, there is provided a method of controlling a delay of a semiconductor device. The method includes generating a plurality of delayed input signals in response to an input signal, the delayed input signals having different delay times, and comparing the input signal and the delayed input signals to generate a plurality of first signals.

The method further includes converting the first signals into a plurality of second signals.

BRIEF DESCRIPTION OF THE DRAWINGS

The foregoing and other features of the present invention will become more apparent to those of ordinary skill in the art by describing in detail exemplary embodiments thereof with reference to the accompanying drawings. Like reference characters refer to like elements throughout the drawings.

DESCRIPTION OF EXEMPLARY EMBODIMENTS

Hereinafter, exemplary embodiments of the present invention will be explained in detail with reference to the accompanying drawings. However, specific structural and functional details disclosed herein are merely presented for purposes of describing the exemplary embodiments of the present invention.

Figure 1:
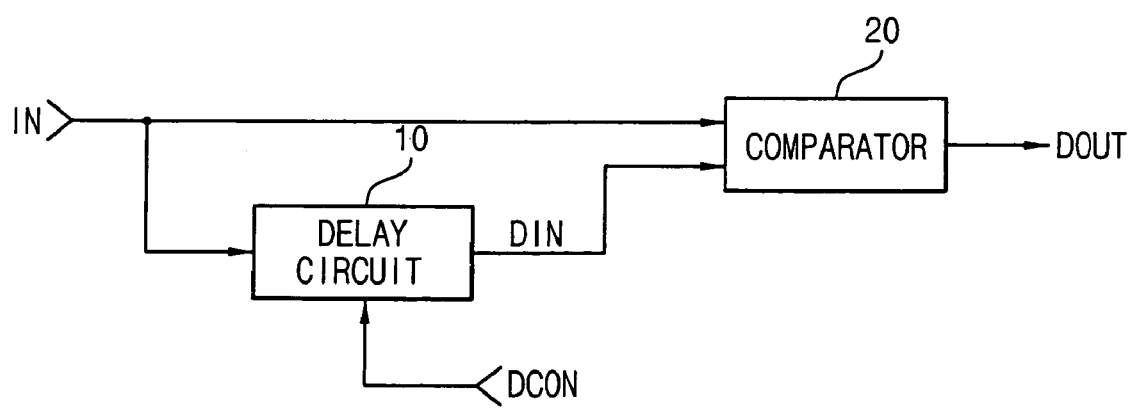
FIG. 1 is a block diagram illustrating a circuit for describing a method of detecting a delay time according to an exemplary embodiment of the present invention.

FIG. 1 is a block diagram illustrating a circuit for describing a method of detecting a delay time according to an exemplary embodiment of the present invention. The circuit of FIG. 1 includes a delay circuit 10 and a comparator 20.

The delay circuit 10 receives an input signal IN, and delays the input signal IN by a predetermined time to generate a delayed input signal DIN under the control of a delay control signal DCON. The comparator 20 generates an output signal DOUT in response to the input signal IN and the delayed input signal DIN.

Figure 2A:
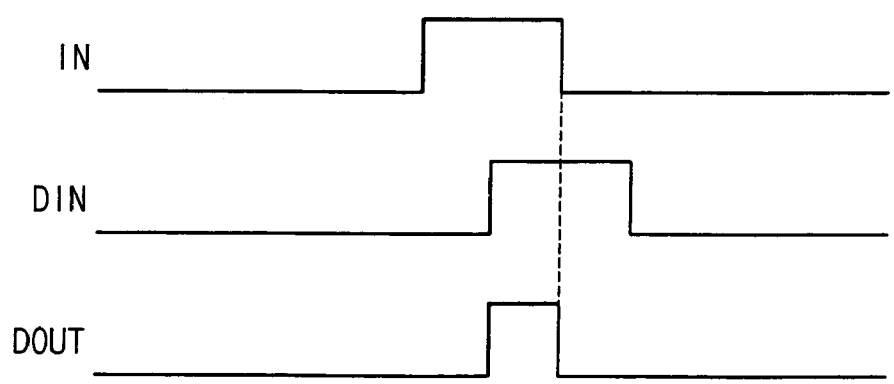
FIG. 2A and FIG. 2B are timing diagrams illustrating the operation of the circuit of FIG. 1.
Figure 2B:
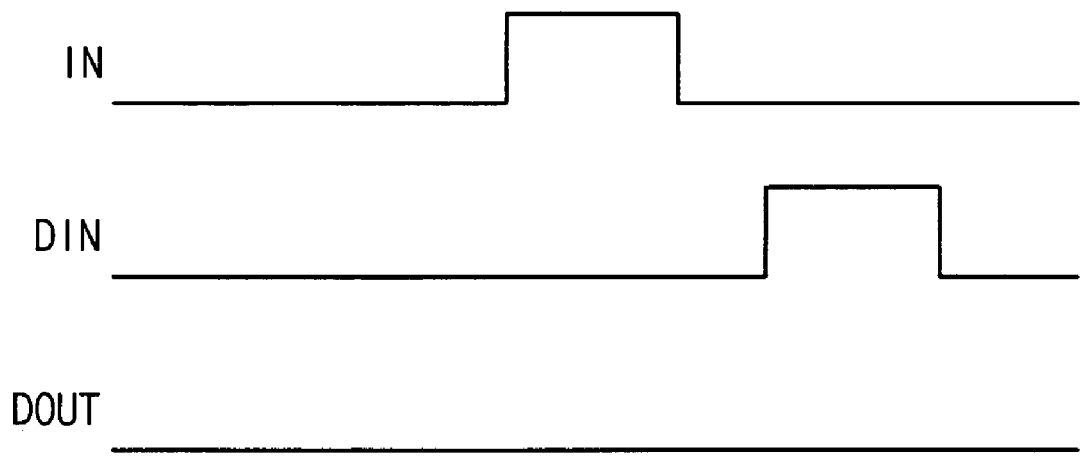

FIG. 2A and FIG. 2B are timing diagrams illustrating the operation of the circuit of FIG. 1.

Hereinafter, a method of detecting a delay time will be described referring to FIG. 1, FIG. 2A and FIG. 2B.

In FIG. 2A, there is a period in which a high level of the delayed input signal DIN is overlapped with a high level of the input signal IN. During this period, the output signal DOUT has a logic "high" state. In FIG. 2B, there is no period in which a high level of the delayed input signal DIN is not overlapped with a high level of the input signal IN. Here, the output signal DOUT maintains a logic "low" state.

Figure 3:
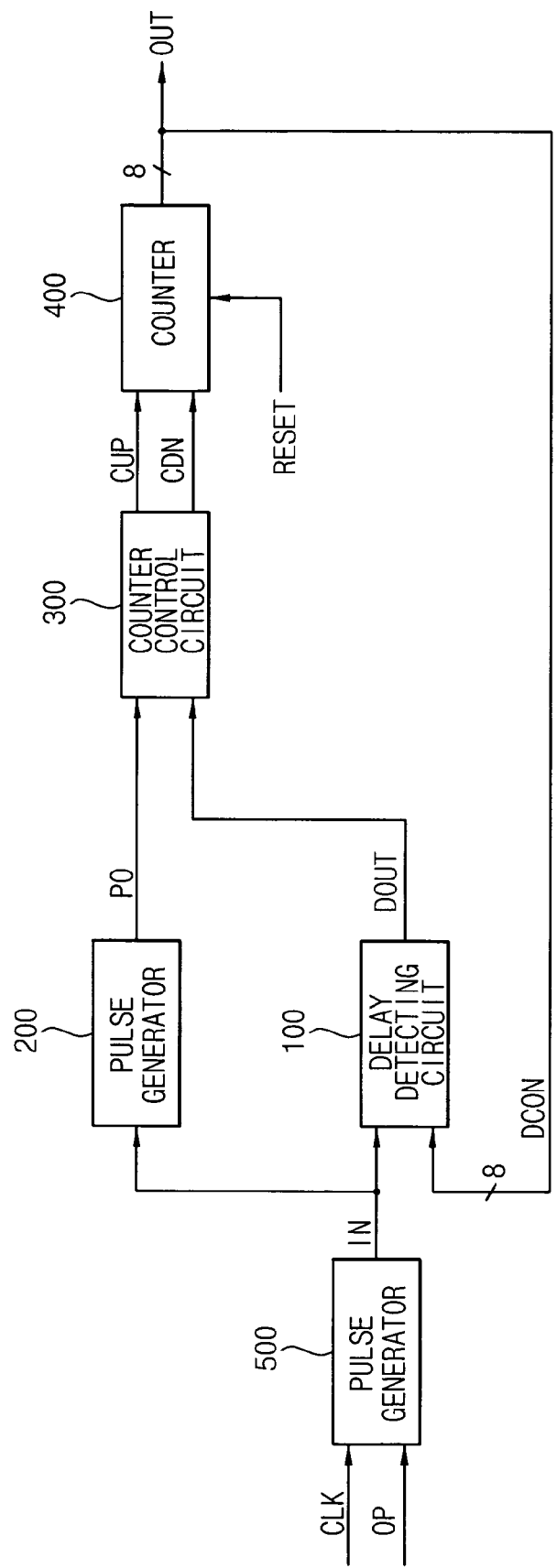
FIG. 3 is a block diagram illustrating a delay control circuit according to a first exemplary embodiment of the present invention.

FIG. 3 is a block diagram illustrating a delay control circuit according to a first exemplary embodiment of the present invention. Referring to FIG. 3, the delay control circuit includes a delay detecting circuit 100, a first pulse generator 200, a counter control circuit 300 and a counter 400. Further, the delay control circuit includes a second pulse generator 500.

The delay detecting circuit 100 delays an input signal IN by a predetermined time in response to a delay control signal DCON, and compares the input signal IN and the delayed input signal to generate a first signal DOUT. Here, the delay control signal DCON is an output signal OUT of the delay control circuit and is an 8-bit digital signal.

The first pulse generator 200 generates a second signal PO having a predetermined pulse width in response to the input signal IN. The counter control circuit 300 generates a count-up signal CUP and a count-down signal CDN in response to the first signal DOUT and the second signal PO. The counter 400 generates the output signal OUT of the delay control circuit in response to the count-up signal CUP and the count-down signal CDN. Here, the output signal OUT of the delay control circuit is an 8-bit digital signal. The counter 400 may be reset by a reset signal RESET. The second pulse generator 500 generates the input signal IN, which is a pulse signal, in response to a clock signal CLK and an enable signal OP.

Hereinafter, the operation of the delay control circuit shown in FIG. 3 will be described.

As shown in FIG. 3, the input signal IN generated in response to the clock signal CLK and the enable signal OP, is transferred to the delay detecting circuit 100 and the first pulse generator 200. The delay detecting circuit 100 delays the input signal IN by a predetermined time. The delay time delayed by the delay detecting circuit 100 is controlled by the delay control signal DCON, which is a feedback signal of the output signal OUT of the delay control circuit. Further, the delay detecting circuit 100 compares the input signal IN and the delayed input signal to generate the first signal DOUT.

The first pulse generator 200 generates the second signal PO having a predetermined pulse width in response to the input signal IN. The second signal PO is used as a reference signal of the counter control circuit 300. The counter control circuit 300 outputs the count-up signal CUP of the logic 'high' state or count-down signal CDN of the logic 'high' state according to the state of the first signal DOUT using the second signal PO as the reference signal.

The counter 400 generates the output signal OUT of the delay control circuit in response to the count-up signal CUP and the count-down signal CDN. In FIG. 3, the counter 400 is a non-cyclic 3-bit counter and outputs the output signal OUT, which is an 8-bit digital signal, from the delay control circuit. For example, as the counter 400 is a non-cyclic counter, when the output signal OUT of the delay control circuit is '0', the counter 400 does not change the output signal OUT to '7', but instead maintains '0' even though the count-down signal CDN is generated. In the same way, when the output signal OUT of the delay control circuit is '7', the counter 400 does not change the output signal OUT to '0', but instead maintains '7' even though the count-up signal CUP is generated.

When the delay time delayed by the delay detecting circuit 100 is short, the count-up signal CUP becomes logic 'high' and the delay control signal DCON, which is the output signal OUT of the counter 400, increases by one bit. Accordingly, the delay time delayed by the delay detecting circuit 100 is increased by the delay control signal DCON, which is fed back to the delay detecting circuit 100. On the contrary, when the delay time delayed by the delay detecting circuit 100 is long, the count-down signal CDN becomes logic 'high' and the delay control signal DCON, which is the output signal OUT of the counter 400, decreases by one bit. Accordingly, the delay time delayed by the delay detecting circuit 100 is decreased by the delay control signal DCON, which is fed back to the delay detecting circuit 100.

The output signal OUT of the delay control circuit may then be used to control the delay time of a delay circuit in a semiconductor integrated circuit. Thus, the delay control circuit of FIG. 3 is capable of controlling a delay time to be in a predetermined range in view of varying operating conditions such as a fabrication process, temperature and voltage by detecting the delay time when such operating conditions vary.

Figure 4:
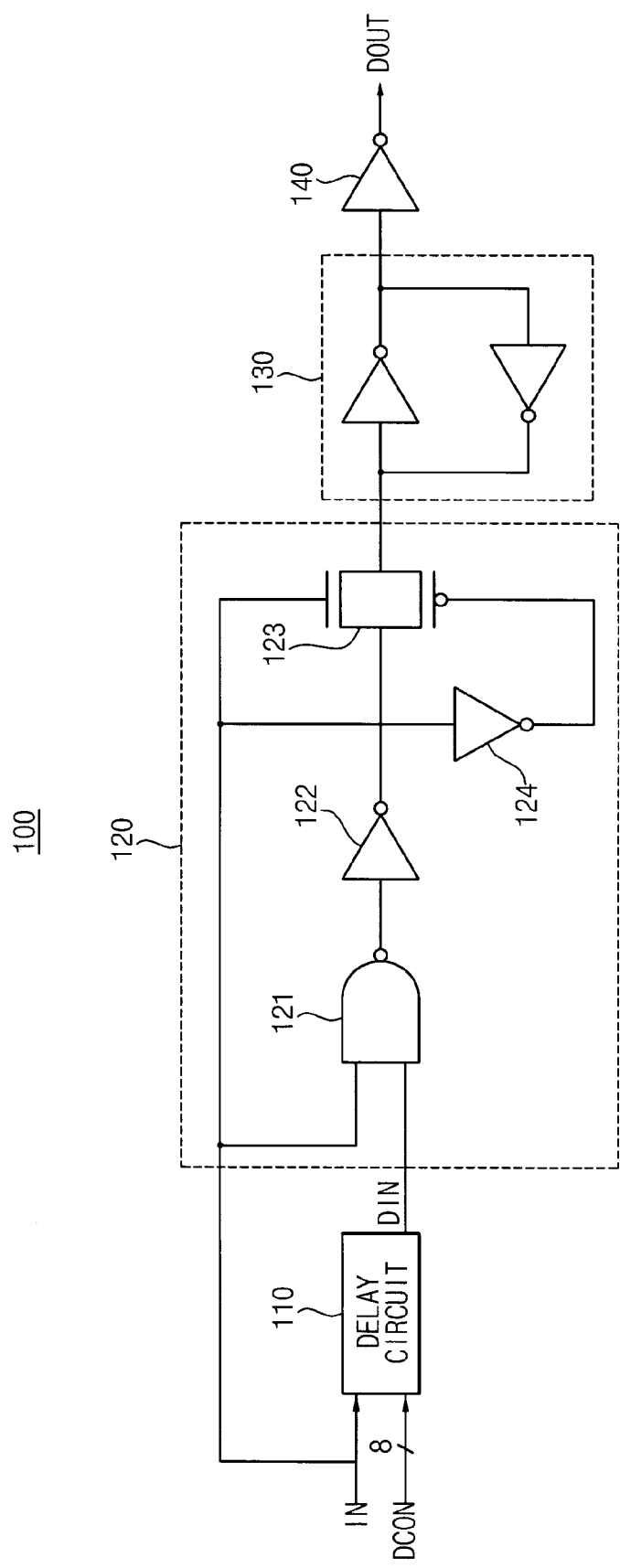
FIG. 4 is a circuit diagram illustrating an exemplary embodiment of a delay detecting circuit included in the delay control circuit of FIG. 3.

FIG. 4 is a circuit diagram illustrating an exemplary embodiment of the delay detecting circuit 100 included in the delay control circuit of FIG. 3. Referring to FIG. 4, the delay detecting circuit 100 includes a delay circuit 110, a comparator 120, a latch circuit 130 and an inverter 140.

The delay circuit 110 delays the input signal IN by the predetermined time to generate the delayed input signal DIN in response to the delay control signal DCON. The comparator 120 compares the input signal IN and the delayed input signal DIN. The latch circuit 130 latches an output signal of the comparator 120. The inverter 140 inverts an output signal of the latch circuit 130 to generate the first signal DOUT.

The comparator 120 includes a NAND gate 121, inverters 122 and 124 and a transmission gate 123. The NAND gate 121 and the inverter 122 function as an AND gate, and perform a logical AND operation on the input signal IN and the delayed input signal DIN. The transmission gate 123 transmits an output signal of the AND gate to a next stage.

Hereinafter, the operation of the delay detecting circuit 100 of FIG. 4 is described.

As shown in FIG. 4, the delay circuit 110 controls the delay time to generate a signal delayed by the controlled delay time. The input signal IN and the delayed input signal DIN generated by the delay circuit 110 are compared with each other by the comparator 120. The comparator 120 performs the logical AND operation on the input signal IN and the delayed input signal DIN and outputs the result in response to the input signal IN.

When there is a period in which a high level of the input signal IN is overlapped with a high level of the delayed input signal DIN, an output signal of the comparator 120 has the logic "high" state. When there is no period in which a high level of the input signal IN is overlapped with a high level of the delayed input signal DIN, the output signal of the comparator 120 maintains the logic "low" state.

Figure 5:
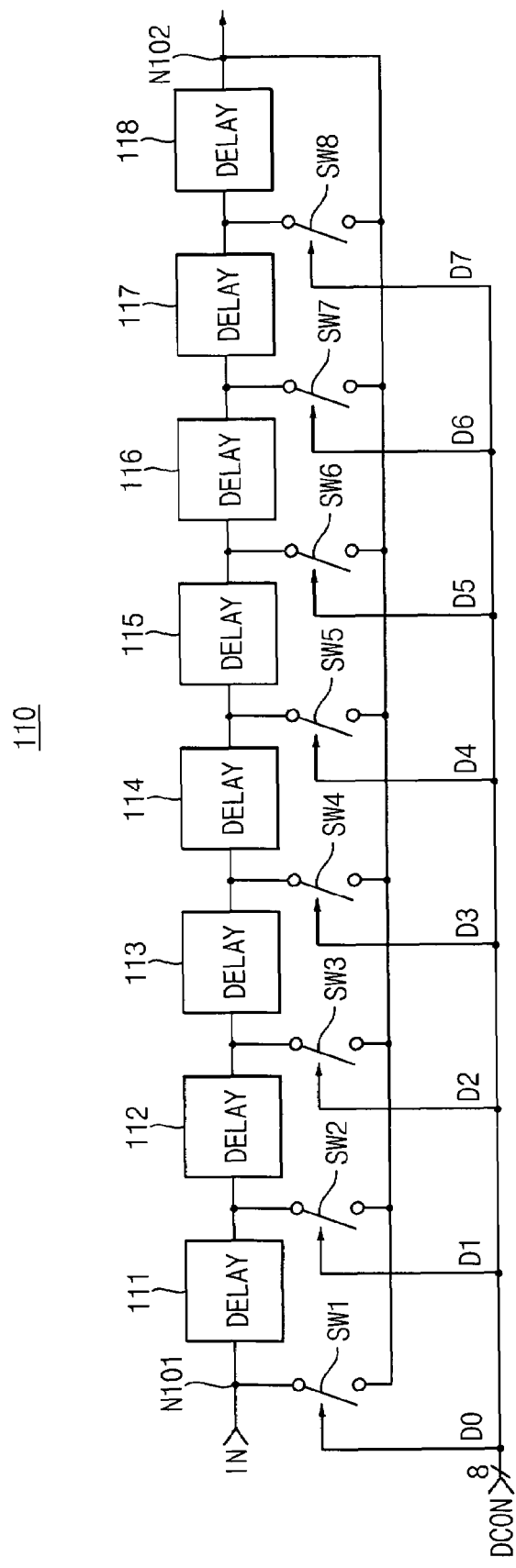
FIG. 5 is a circuit diagram illustrating an exemplary embodiment of a delay circuit included in the delay detecting circuit of FIG. 4.

FIG. 5 is a circuit diagram illustrating an exemplary embodiment of the delay circuit 110 included in the delay detecting circuit 100 of FIG. 4. Referring to FIG. 5, the delay circuit 110 includes delay cells 111 to 118 and switches SW1 to SW8.

The delay cells 111 to 118 are coupled in a cascade form between an input node N101 to which the input signal IN is applied and an output node N102 from which the delayed input signal DIN is outputted. The switches SW1 to SW8 are coupled between the input node N101 and the output node N102 and are coupled between input and output nodes of corresponding delay cells 111 to 118. The switches are switched in response to the delay control signal DCON. The delay control signal DCON is an 8-bit signal and includes eight signals D0 to D7. All of the delay cells 111 to 118 included in the delay circuit 110 may have the same structure and the same delay time.

Hereinafter, the operation of the delay circuit 110 of FIG. 5 will be described.

As shown in FIG. 5, when the bit structure of the delay control signal DCON is 00000000, e.g., all the bits of the delay control signal are logic 0, the switches SW1 to SW8 are opened and all the delay cells 111 to 118 are connected in a cascade form between the input node N101 and the output node N102. At this time, the delay time between the input signal IN and the delayed input signal DIN is its longest.

When the bit structure of the delay control signal DCON is 10000000, e.g., a bit D0 of the delay control signal DCON is logic 1 and the bits D1 to D7 of the delay control signal are logic 0, the switch SW1 is closed and the switches SW2 to SW8 are opened. Here, the input node N101 and the output node N102 are connected to each other, and the delay cells between the input node N101 and the output node N102 do not contribute to the delay time of the delay circuit 110. At this time, the delay time between the input signal IN and the delayed input signal DIN is its shortest.

When the bit structure of the delay control signal DCON is 01000000, e.g., a bit D1 of the delay control signal DCON is logic 1 and the bits D0 and D2 to D7 of the delay control signal are logic 0, the switch SW2 is closed and the switches SW1 and SW3 to SW8 are opened. At this time, only the delay cell 111 contributes to the delay time of the delay circuit 110. The delay cells 112 to 118 do not contribute to the delay time of the delay circuit 110. Here, the delay time may be referred to as being short.

When the bit structure of the delay control signal DCON is 00000001, e.g., a bit D7 of the delay control signal DCON is logic 1 and the bits D0 to D6 of the delay control signal are logic 0, the switch SW8 is closed and the switches SW1 to SW7 are opened. At this time, the delay cells 111 to 117 contribute to the delay time of the delay circuit 110. The delay cell 118 does not contribute to the delay time of the delay circuit 110. Here, the delay time may be referred to as being long.

As such, the delay circuit 110 can control the delay time of the delay control circuit by adjusting the number of the delay cells 111 to 118 coupled between the input node N101 and the output node N102 that contribute to the delay time in response to the delay control signal DCON.

Figure 6:
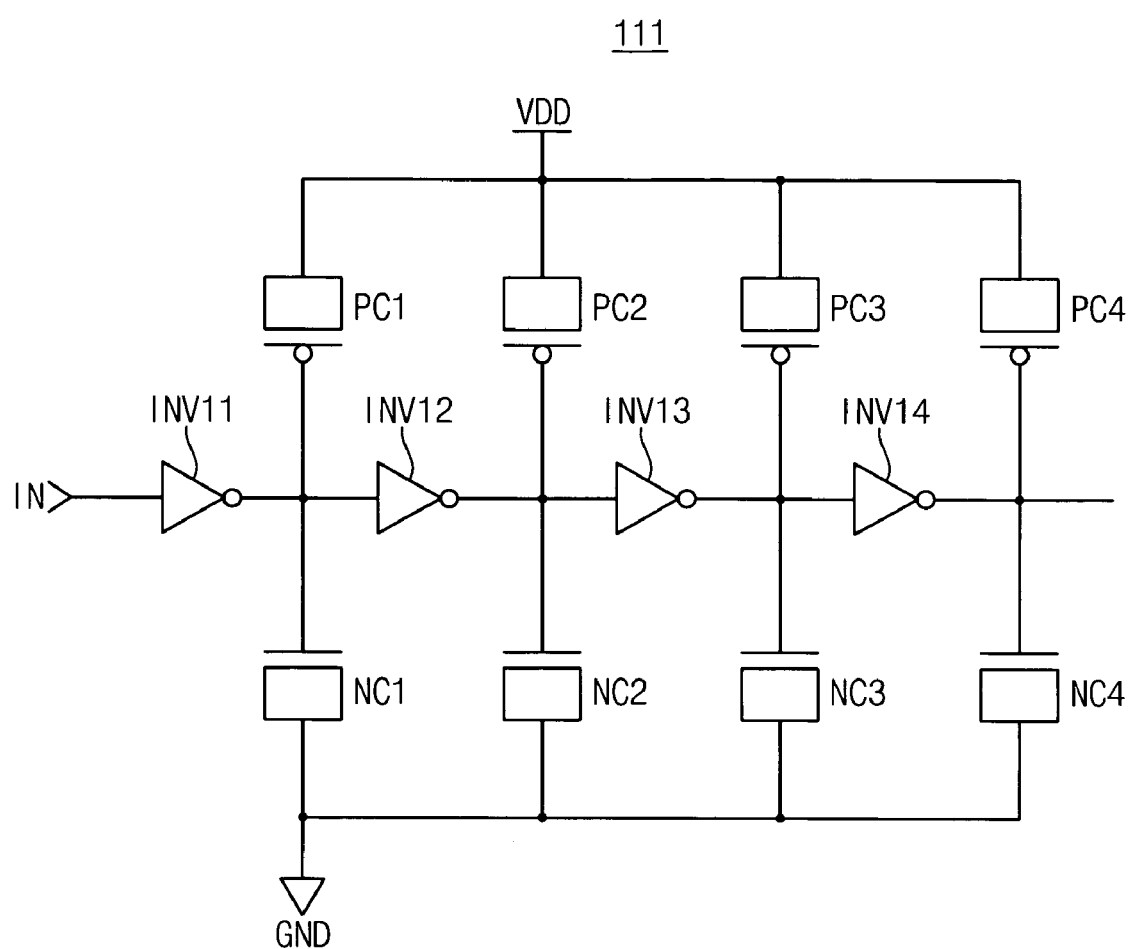
FIG. 6 is a circuit diagram illustrating an exemplary embodiment of a delay cell included in the delay circuit of FIG. 5.

FIG. 6 is a circuit diagram illustrating an exemplary embodiment of the delay cell 111 included in the delay circuit 110 of FIG. 5. Referring to FIG. 6, the delay cell 111 includes inverters INV11 to INV14, PMOS capacitors PC1 to PC4 and NMOS capacitors NC1 to NC4.

The inverters INV11 to INV14 are connected in a cascade form. The PMOS capacitors PC1 to PC4 are coupled between an output terminal of each of the inverters INV11 to INV14 and a supply voltage VDD, and the NMOS capacitors NC1 to NC4 are coupled between an output terminal of each of the inverters INV11 to INV14 and a ground voltage GND.

The input signal IN is delayed by a predetermined time through the inverters INV11 to INV14, the PMOS capacitors PC1 to PC4 and the NMOS capacitors NC1 to NC4. To maintain a rise time and a fall time of the input signal IN to be equal, the PMOS capacitors PC1 to PC4 and the NMOS capacitors NC1 to NC4 are arranged in pairs between the supply voltage VDD and the ground voltage GND.

Figure 7:
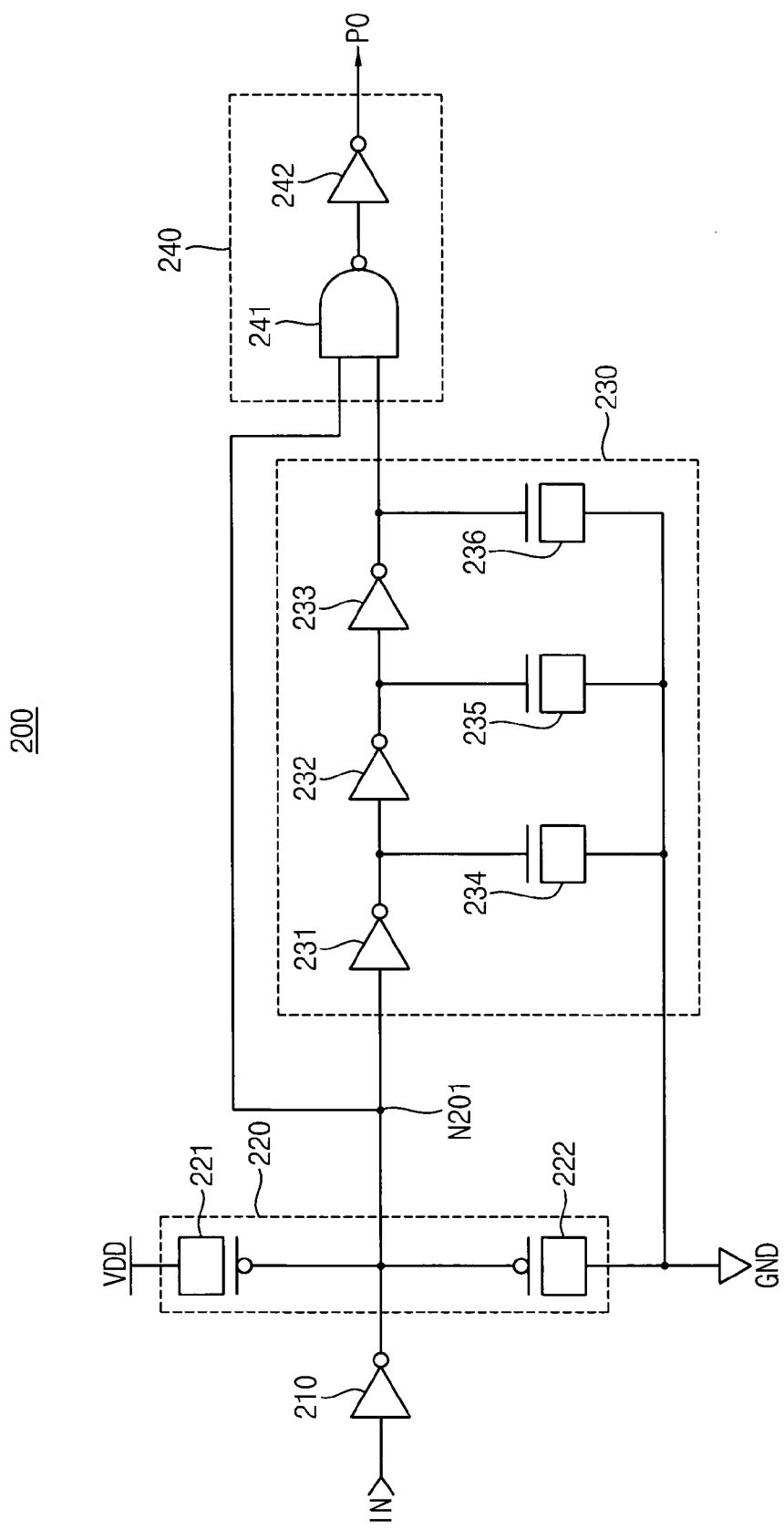
FIG. 7 is a circuit diagram illustrating an exemplary embodiment of a first pulse generator included in a delay control circuit of FIG. 3.

FIG. 7 is a circuit diagram illustrating an exemplary embodiment of the first pulse generator 200 included in the delay control circuit of FIG. 3. Referring to FIG. 7, the first pulse generator 200 includes a delay circuit 230 and an AND gate 240. The AND gate 240 includes a NAND gate 241 and an inverter 242. Further, the first pulse generator 200 may include an inverter 210 and a capacitor pair 220. The capacitor pair 220 may include a PMOS capacitor 221 and an NMOS capacitor 222.

The inverter 210 inverts the input signal IN and delays the input signal IN by a predetermined time. The capacitor pair 220 delays the input signal IN by an equal time when the input signal IN rises and when the input signal IN falls. The delay circuit 230 delays a signal of a node N201. The AND gate 240 performs a logical AND operation on the signal of the node N201 and an output signal of the delay circuit 230.

The output signal PO of the first pulse generator 200 has a pulse width in which the logic 'high' level of the signal of the node N201 and the logic 'high' level of the output signal of the delay circuit 230 are overlapped. The inverters 231 to 233 and the capacitors 234 to 236 determine the delay time of the delay circuit 230. The output signal PO of the first pulse generator 200 may be used as a reference signal of the counter control circuit 300 in FIG. 3 of the delay control circuit.

Figure 8:
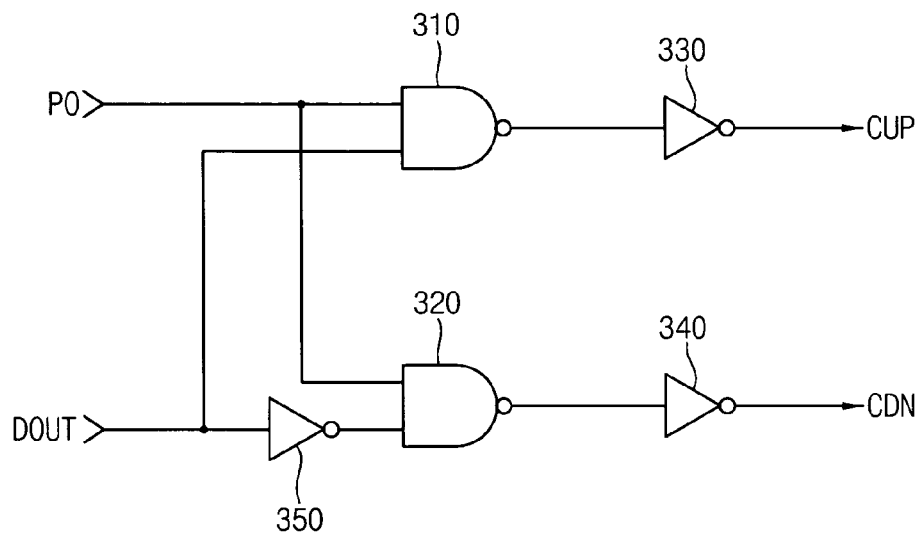
FIG. 8 is a circuit diagram illustrating an exemplary embodiment of a counter control circuit included in the delay control circuit of FIG. 3.

FIG. 8 is a circuit diagram illustrating an exemplary embodiment of the counter control circuit 300 included in the delay control circuit of FIG. 3. Referring to FIG. 8, the counter control circuit 300 includes inverters 330, 340 and 350 and NAND gates 310 and 320.

The inverter 350 inverts the output signal DOUT of the delay detecting circuit 100 in FIG. 3. The NAND gate 310 performs a logical NAND operation on the output signal PO of the first pulse generator 200 in FIG. 3 and the output signal DOUT of the delay detecting circuit 100 in FIG. 3. The inverter 330 inverts an output signal of the NAND gate 310 and generates the count-up signal CUP. The NAND gate 320 performs a logical NAND operation on the output signal PO of the first pulse generator 200 in FIG. 3 and an output signal of the inverter 350. The inverter 340 inverts an output signal of the NAND gate 320 and generates the count-down signal CDN.

Figure 9:
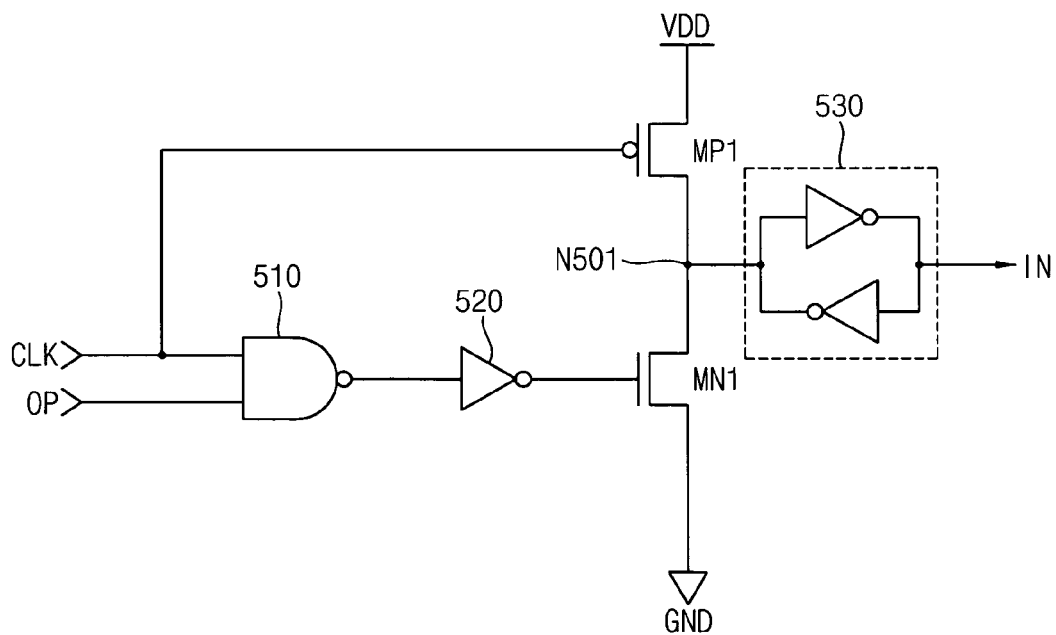
FIG. 9 is a circuit diagram illustrating an exemplary embodiment of a second pulse generator included in the delay control circuit of FIG. 3.

FIG. 9 is a circuit diagram illustrating an exemplary embodiment of the second pulse generator 500 included in the delay control circuit of FIG. 3. Referring to FIG. 9, the second pulse generator 500 includes a NAND gate 510, an inverter 520, a PMOS transistor MP1, an NMOS transistor MN1 and a latch circuit 530.

The NAND gate 510 and the inverter 520 function as an AND gate, and perform a logical AND operation on the clock signal CLK and an enable signal OP. The PMOS transistor MP1 pulls up a node N501 to a level of the supply voltage VDD in response to the clock signal CLK. The NMOS transistor MN1 pulls down the node N501 to a level of the ground voltage GND in response to an output signal of the inverter 520. The latch circuit 530 latches a signal of the node N501.

Figure 10:
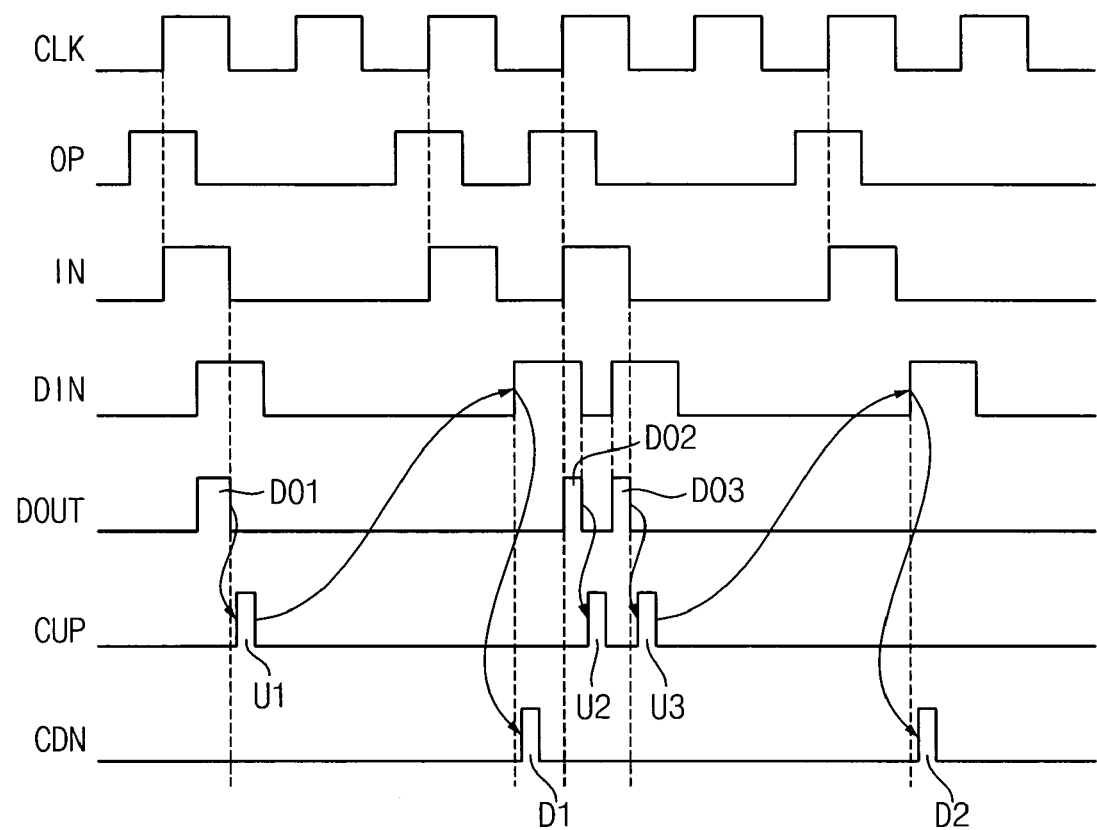
FIG. 10 is a timing diagram illustrating the operation of the delay control circuit of FIG. 3.

FIG. 10 is a timing diagram illustrating an operation of the delay control circuit of FIG. 3.

Referring to FIG. 10, when the enable signal OP is in the logic 'high' state and the clock signal CLK changes from the logic 'low' state to the logic 'high' state, the input signal IN of a pulse form is generated. The result of the logical AND operation on the input signal IN and the delayed input signal DIN is the output signal DOUT of the delay detecting circuit 100 in FIG. 3. When a high level of the delayed input signal DIN is overlapped with a high level of the input signal IN, the output signal DOUT of the delay detecting circuit 100 in FIG. 3 is generated in a pulse form. When a pulse DO1 is generated, a pulse U1 of the count-up signal CUP is generated.

Referring to FIG. 3 to FIG. 5, when the pulse U1 of the count-up signal CUP is generated, the delay control signal DCON, which is the output signal OUT of the counter 400, is shifted one bit. For example, when the delay control signal DCON is changed from 10000000 to 01000000, the delayed input signal DIN, which is the output signal of the delay circuit 110, has a delay time that is increased by the time delayed by the delay cell 111.

When the delay time is increased and there is no overlapped portion of the high level of the delayed input signal DIN and the high level of the input signal IN, the pulse of the output signal DOUT of the delay detecting circuit 100 in FIG. 3 is not generated, and the pulse D1 of the count-down signal CDN is generated.

In FIG. 10, a pulse U2 of the count-up signal CUP is generated based on a pulse DO2, and a pulse U3 of the count-up signal CUP is generated based on a pulse DO3.

Referring back to FIG. 3 and FIG. 5, when the pulse U3 of the count-up signal CUP is generated, the delay control signal DCON, which is the output signal OUT of the counter 400, is shifted one bit. Therefore, the delayed input signal DIN has a delay time that is increased when compared with a prior state, wherein the delayed input signal DIN is the output signal of the delay circuit 110.

When the delay time is increased and there is no overlapped portion of the high level of the delayed input signal DIN and the high level of the input signal IN, the pulse of the output signal DOUT of the delay detecting circuit 100 in FIG. 3 is not generated, and the pulse D2 of the count-down signal CDN is generated.

Figure 11:
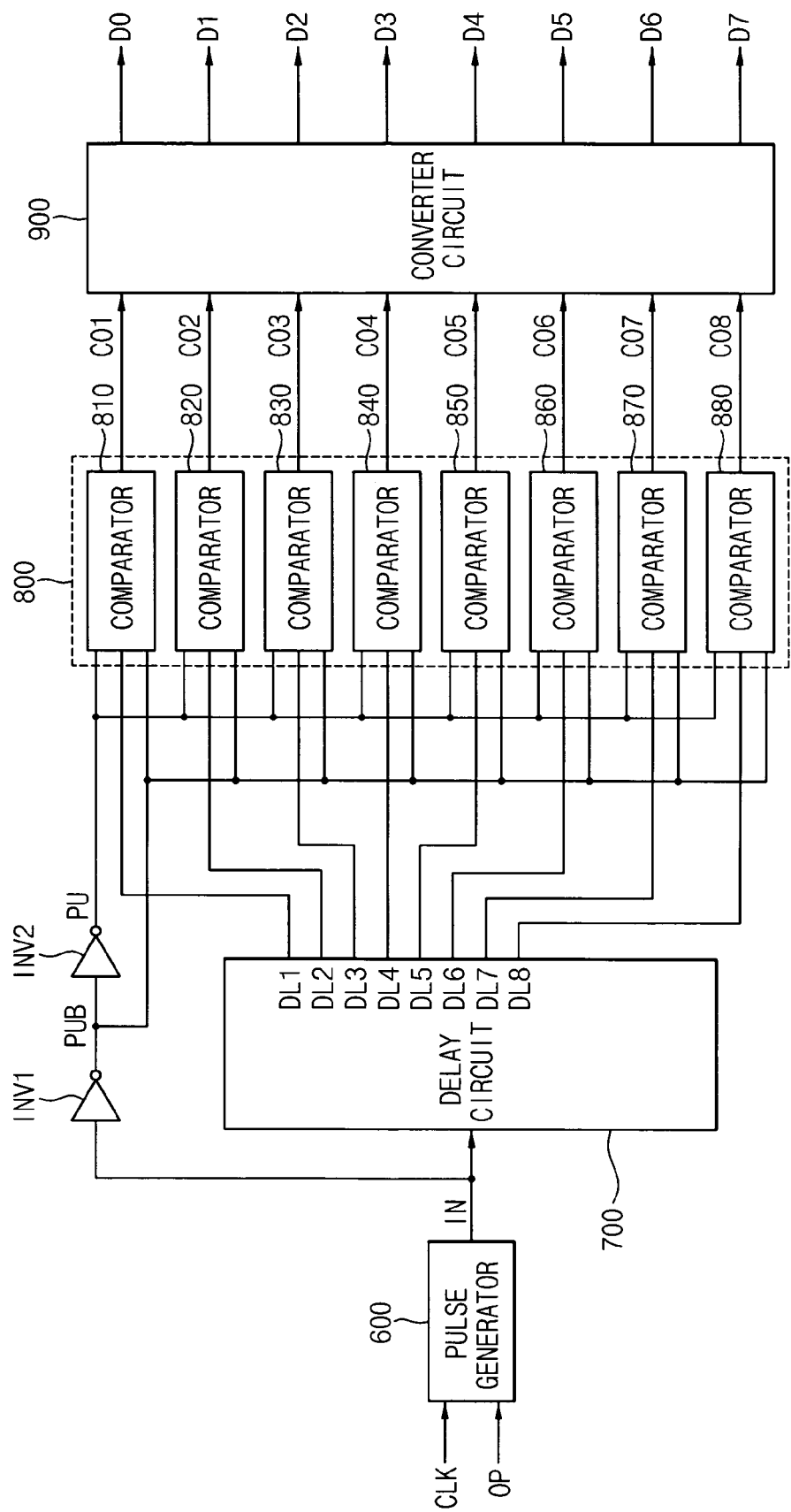
FIG. 11 is a circuit diagram illustrating a delay control circuit according to a second exemplary embodiment of the present invention.

FIG. 11 is a circuit diagram illustrating a delay control circuit according to a second exemplary embodiment of the present invention. Referring to FIG. 11, the delay control circuit includes a delay circuit 700, a comparing circuit 800 and a converter circuit 900. Further, the delay control circuit includes a pulse generator 600 and inverters INV1 and INV2.

The pulse generator 600 generates an input signal IN responding to a clock signal CLK and an enable signal OP. The inverter INV1 inverts the input signal IN, and the inverter INV2 inverts an output signal PUB of the inverter INV1. The output signal PUB of the inverter INV1 is a pulse signal that has an opposite phase from the input signal IN, and an output signal PU of the inverter INV2 is a pulse signal that has a same phase as the input signal IN.

The delay circuit 700 receives the input signal IN and generates eight delayed input signals DL1 to DL8 in response to the input signal IN. Each of the delayed input signals DL1 to DL8 has a different delay time. The comparing circuit 800 includes comparators 810, 820, 830, 840, 850, 860, 870 and 880, and compares the input signal IN and each of the delayed input signals DL1 to DL8 to generate eight output signals CO1 to CO8.

The converter circuit 900 converts the output signals CO1 to CO8 into signals D0 to D7.

Hereinafter, the operation of the delay control circuit according to the second embodiment of the present invention shown in FIG. 11 will be described.

In FIG. 11, the delay circuit 700 generates the eight delayed input signals DL1 to DL8. Each of the comparators 810, 820, 830, 840, 850, 860, 870 and 880 included in the comparing circuit 800 compares the input signal IN and one of the delayed input signals DL1 to DL8.

Some of the delayed input signals DL1 to DL8 may have logic 'high' levels that are overlapped with the logic 'high' level of the input signal IN, and some of the delayed input signals DL1 to DL8 may have logic 'high' levels that are not overlapped with the logic 'high' level of the input signal IN. When the logic 'high' level of each of the delayed input signals DL1 to DL8 and the logic 'high' level of the input signal IN overlap, a corresponding comparator from the comparing circuit 800 outputs a signal having the logic 'high' state. When the logic 'high' level of each of the delayed input signals DL1 to DL8 and the logic 'high' level of the input signal IN do not overlap, a corresponding comparator from the comparing circuit 800 outputs a signal having the logic 'low' state.

It is to be understood that there may be a plurality of signals having the logic 'high' state. However, to apply the output signals D0 to D7 of the delay control circuit of FIG. 11 to a delay circuit having a structure as shown, for example, in FIG. 5, in which one switch is on at one time, the output signals CO1 to CO8 of the comparing circuit 800 should have the logic 'high' state at one time.

Still referring to FIG. 11, the converter circuit 900 converts the output signals CO1 to CO8 of the comparing circuit 800 into the signals D0 to D7 that may be used in a delay circuit.

For example, when CO1=1, CO2=1, CO3=1, CO4=1, CO5=0, CO6=0, CO7=0 and CO8=0, the output signals of the converter circuit 900 may be D0=0, D1=0, D2=0, D3=1, D4=0, D5=0, D6=0 and D7=0. In other words, when searching from CO8 to CO1, a signal that is changed from logic '0' to logic '1' is set to logic '1', and the rest of the signals remain at logic '0'.

The output signals D0 to D7 may be used to control a delay time of a delay circuit included in a semiconductor integrated circuit similar to that as described above with reference to the output signal DOUT of the delay control circuit of FIG. 3.

Figure 12:
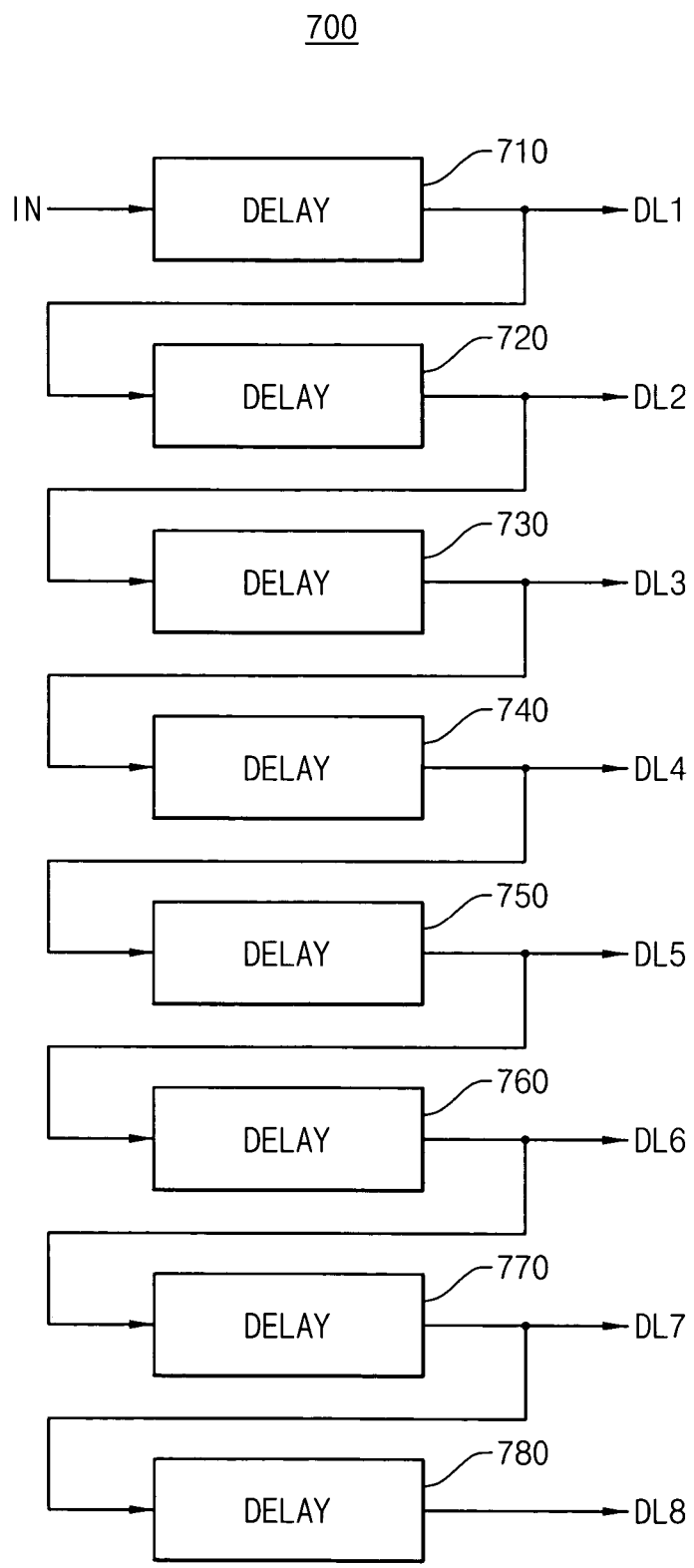
FIG. 12 is a block diagram illustrating an exemplary embodiment of a delay circuit included in the delay control circuit of FIG. 11.

FIG. 12 is a block diagram illustrating an exemplary embodiment of the delay circuit 700 included in the delay control circuit of FIG. 11. Referring to FIG. 12, the delay circuit 700 includes eight delay cells 710, 720, 730, 740, 750, 760, 770 and 780.

The delay circuit 700 generates the delayed input signals DL1 to DL8 and supplies the delayed input signals DL1 to DL8 to an output node of each of the delay cells 710, 720, 730, 740, 750, 760, 770 and 780. The input signal IN is applied to an input terminal of the delay cell 710. The delay cell 111 shown in FIG. 6 may be used for each of the delay cells 710, 720, 730, 740, 750, 760, 770 and 780.

The delay circuit 700 outputs the delayed input signals DL1 to DL8 at an output terminal of each of the delay cells 710, 720, 730, 740, 750, 760, 770 and 780.

Figure 13:
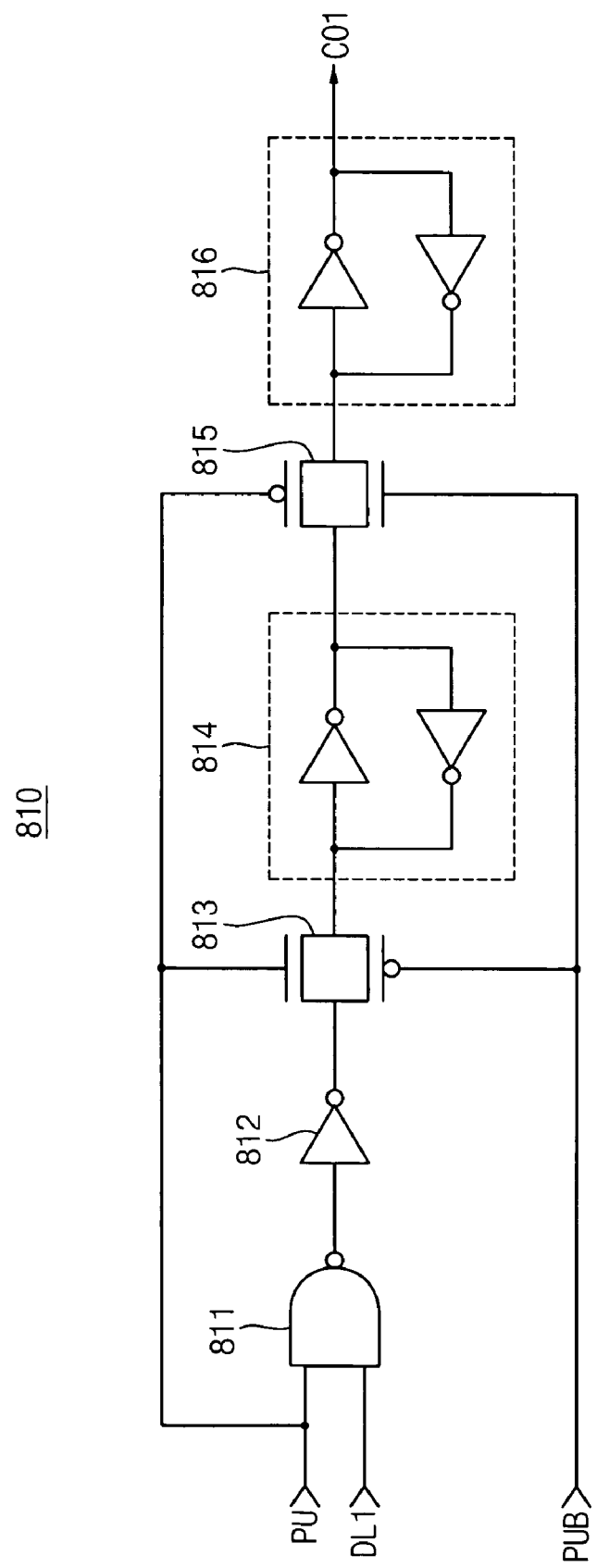
FIG. 13 is a circuit diagram illustrating an exemplary embodiment of a comparator included in a comparing circuit in the delay control circuit of FIG. 11.

FIG. 13 is a circuit diagram illustrating an exemplary embodiment of the comparator 810 included in the comparing circuit 800 in the delay control circuit of FIG. 11. Referring to FIG. 13, the comparator includes a NAND gate 811, an inverter 812, transmission gates 813 and 815 and latch circuits 814 and 816.

The NAND gate 811 and the inverter 812 function as an AND gate, and perform a logical AND operation on a pulse signal PU, which has the same phase as the input signal IN, and one of the delayed input signals DL1 to DL8.

The first transmission gate 813 transmits the output signal of the inverter 812 to the first latch circuit 814 in response to the pulse signal PU and an inverted pulse signal PUB. The first latch circuit 814 latches an output signal of the first transmission gate 813. The second transmission gate 815 transmits the output signal of the first latch circuit 814 to the second latch circuit 816 in response to the pulse signal PU and the inverted pulse signal PUB. The second latch circuit 816 latches an output signal of the second transmission gate 815.

Although not illustrated, it is to be understood that the comparators 820 through 880 may each have the same or similar structure and operating characteristics as the comparator 810.

Hereinafter, the operation of the comparator 810 of FIG. 13 will be described.

As shown in FIG. 13, the pulse signal PU is a pulse signal having a same phase as the input signal IN, and the inverted pulse signal PUB is a pulse signal having a phase opposite the input signal IN. When both the pulse signal PU and the delayed input signal DL1 have the logic 'high' state, the output signal of the inverter 812 has the logic 'high' state and the output signal CO1 of the comparator 810 has the logic 'high' state.

The comparator 810 includes transmission gates 813 and 815 that perform switching in response to the pulse signal PU and the inverted pulse signal PUB. The first transmission gate 813 turns on when the pulse signal PU is in the logic 'high' state, and turns off when the pulse signal PU is in the logic 'low' state. On the contrary, the second transmission gate 815 turns on when the pulse signal PU is in the logic 'low' state, and turns off when the pulse signal PU is in the logic 'high' state. Therefore, the comparator 810 outputs the input signal IN as the output signal CO1 when the pulse signal PU changes from the logic 'high' state to the logic 'low' state. In other words, when the input signal IN changes from the logic 'high' state to the logic 'low' state, the comparator 810 outputs the input signal IN as the output signal CO1.

Figure 14:
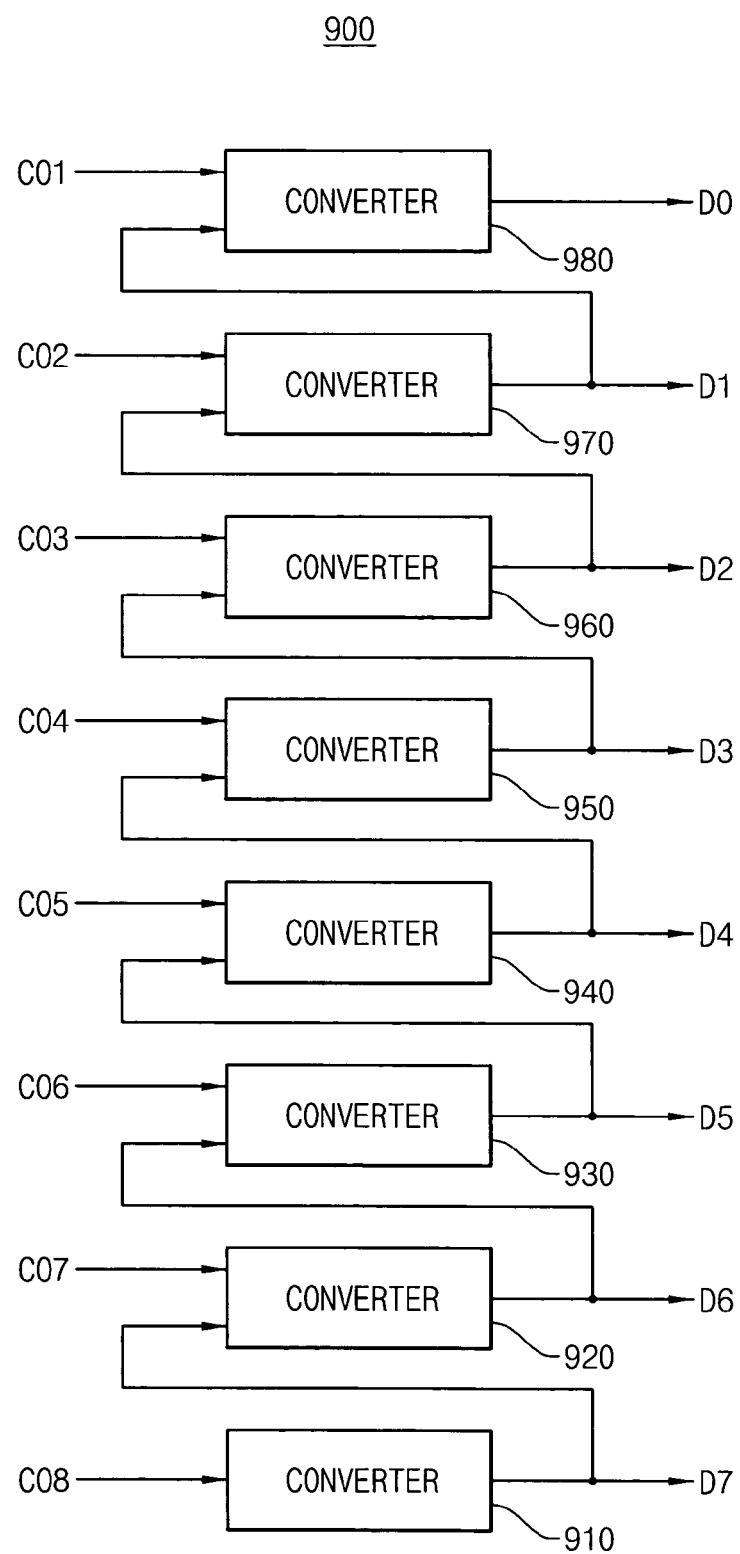
FIG. 14 is a block diagram illustrating an exemplary embodiment of a converter circuit included in the delay control circuit of FIG. 11.

FIG. 14 is a block diagram illustrating an exemplary embodiment of the converter circuit 900 included in the delay control circuit of FIG. 11. Referring to FIG. 14, the converter circuit 900 includes first to eighth converters 910, 920, 930, 940, 950, 960, 970 and 980.

The first converter 910 generates first data D7 in response to the output signal CO8 of the comparing circuit 800. The second converter 920 generates second data D6 in response to the output signal CO7 of the comparing circuit 800 and the first data D7. The third converter 930 generates third data D5 in response to the output signal CO6 of the comparing circuit 800 and the second data D6. The fourth converter 940 generates fourth data D4 in response to the output signal CO5 of the comparing circuit 800 and the third data D5. The fifth converter 950 generates fifth data D3 in response to the output signal CO4 of the comparing circuit 800 and the fourth data D4. The sixth converter 960 generates sixth data D2 in response to the output signal CO3 of the comparing circuit 800 and the fifth data D3. The seventh converter 970 generates seventh data D1 in response to the output signal CO2 of the comparing circuit 800 and the sixth data D2. The eighth converter 980 generates eighth data D0 in response to the output signal CO1 of the comparing circuit 800 and the seventh data D1.

Figure 15:
FIG. 15 is a block diagram illustrating an exemplary embodiment of a converter included in the converter circuit of FIG. 14.

FIG. 15 is a circuit diagram illustrating an exemplary embodiment of the first converter 910 included in the converter circuit 900 of FIG. 14. Referring to FIG. 15, the first converter 910 includes a resistor R1.

Figure 16:
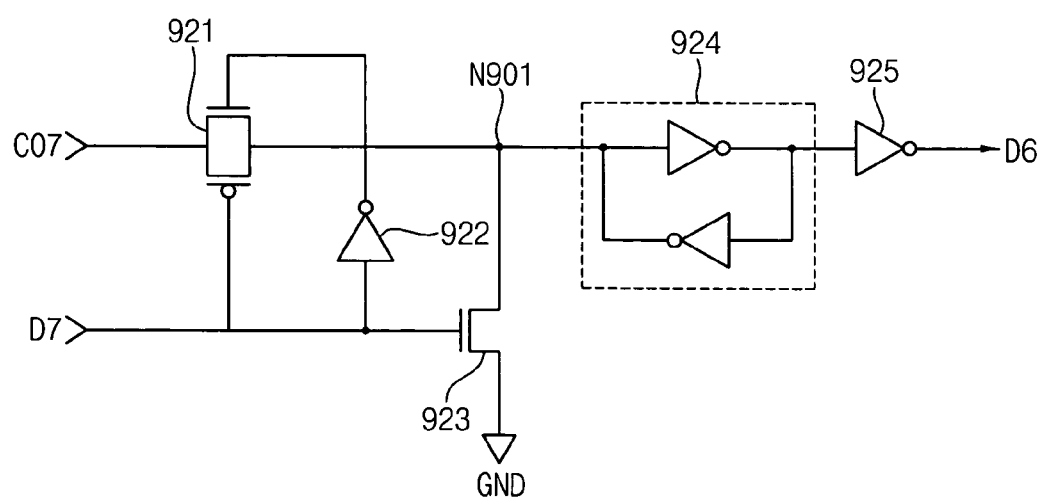
FIG. 16 is a block diagram illustrating an exemplary embodiment of another converter included in the converter circuit of FIG. 14.

FIG. 16 is a circuit diagram illustrating an exemplary embodiment of the second converter 920 included in the converter circuit 900 of FIG. 14. Referring to FIG. 16, the second converter includes a transmission gate 921, inverters 922 and 925, an NMOS transistor 923 and a latch circuit 924.

The inverter 922 inverts the first data D7. The transmission gate 921 transmits the output signal CO7 of the comparing circuit 800 to a node N901 in response to the first data D7. The NMOS transistor 923 pulls down the node N901 to a level of the ground voltage GND in response to the first data D7. The latch circuit 924 latches a signal of the node N901. The inverter 925 inverts an output signal of the latch circuit 924.

Still referring to FIG. 16, the second data D6 has the logic 'low' state when the first data D7, which is the output signal of the prior converter 910 of FIG. 14, has the logic 'high' state. When the first data D7 is in the logic 'low' state, the NMOS transistor 923 is off and the output signal CO7 of the comparing circuit 800 of FIG. 11 is outputted as the second data D6.

Although not illustrated, it is to be understood that the third through seventh converters 930 through 970 may each have the same or similar structure as the second converter 920.

Figure 17:
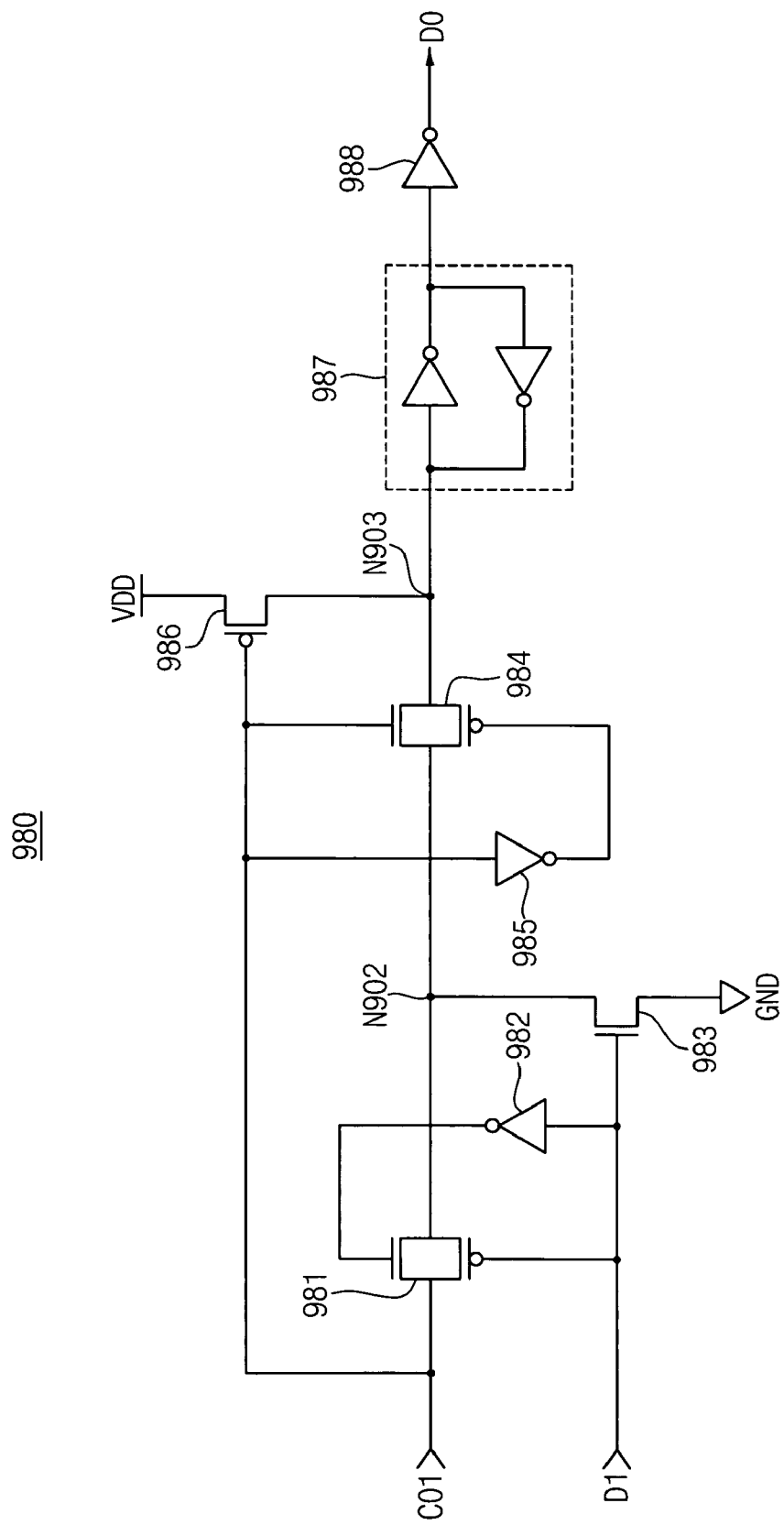
FIG. 17 is a block diagram illustrating an exemplary embodiment of yet another converter included in the converter circuit of FIG. 14.

FIG. 17 is a block diagram illustrating an exemplary embodiment of the eighth converter 980 included in the converter circuit 900 of FIG. 14. Referring to FIG. 17, the eighth converter 980 includes a first transmission gate 981, an NMOS transistor 983, a second transmission gate 984, a PMOS transistor 986, a latch circuit 987 and inverters 982, 985 and 988.

The inverter 982 inverts the seventh data D1. The first transmission gate 981 transmits the output signal CO1 of the comparing circuit 800 of FIG. 11 to a node N902 in response to the seventh data D1 and an output signal of the inverter 982. The NMOS transistor 983 pulls down the node N902 to a level of the ground voltage GND in response to the seventh data D1. The inverter 985 inverts the output signal CO1 of the comparing circuit 800 of FIG. 11. The second transmission gate 984 transmits a signal of the node N902 to a node N903 in response to the output signal CO1 of the comparing circuit 800 of FIG. 11 and an output signal of the inverter 985. The PMOS transistor 986 pulls up the node N903 to a level of the supply voltage VDD in response to the output signal CO1 of the comparing circuit 800 of FIG. 11. The latch circuit 987 latches a signal of the node N903. The inverter 988 inverts an output signal of the latch circuit 987.

Still referring to FIG. 17, the eighth data D0 has the logic 'low' state when the seventh data D1, which is the output signal of the prior converter 970 of FIG. 14, has the logic 'high' state. When the seventh data D1 is in the logic 'low' state, the NMOS transistor 983 is off and the output signal CO1 of the comparing circuit 800 of FIG. 11 is outputted as the eighth data D0. When the output signal CO1 of the comparing circuit 800 of FIG. 11 has the logic 'low' state, the PMOS transistor 986 is on, the signal of the node N903 has the logic 'high' state and the eighth data D0 has the logic 'high' state.

It is to be understood by one of ordinary skill in the art that although the delay control circuits of FIG. 3 and FIG. 11 have been described as controlling the delay time of a delay circuit by using, for example, an 8-bit delay control signal, the delay control circuits of FIG. 3 and FIG. 11 may be used to control the delay time of a delay circuit by using a delay control signal having a number of bits that is greater than 1 or less than 8. In addition, the delay control circuits of FIG. 3 and FIG. 11 may be configured to control the delay time of a delay circuit by using a delay control signal having a number of bits that is greater than 8.

According to an exemplary embodiment of the present invention, a delay control circuit can be used to detect and control a delay time to be in a predetermined range despite changes in operating conditions that may affect a semiconductor device on which the delay control circuit is embedded, thus enabling the semiconductor device to operate normally in view of operating conditions such as a fabrication process, temperature, and voltage change.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay control circuit, comprising:
   a delay detecting circuit configured to delay an input signal by a delay time in response to an output signal and compare the input signal and the delayed input signal to generate a first signal;
   a first pulse generator configured to generate a second signal in response to the input signal;
   a counter control circuit configured to generate a count-up signal and a count-down signal in response to the first signal and the second signal; and
   a counter configured to generate the output signal in response to the count-up signal and the count-down signal to divide the delay time by $2^n$ intervals, wherein n is a positive integer.

2. The delay control circuit of claim 1, wherein the delay detecting circuit includes:
   a delay circuit configured to delay the input signal by the delay time to generate the delayed input signal in response to the output signal;
   a comparator configured to compare the input signal and the delayed input signal; and
   a latch circuit configured to latch an output signal of the comparator.

3. The delay control circuit of claim 2, wherein the delay detecting circuit further includes an inverter for inverting an output of the latch circuit.

4. The delay control circuit of claim 2, wherein the delay circuit includes:
   $2^n$ delay cells coupled in a cascade form between an input node to which the input signal is applied and an output node to which the delayed input signal is outputted; and
   $2^n$ switches coupled between the input node and the output node and between input and output nodes of corresponding delay cells, wherein the switches are switched in response to the output signal.

5. The delay control circuit of claim 4, wherein each of the delay cells includes:
   a plurality of inverters connected in a cascade form;
   PMOS capacitors coupled between an output terminal of each of the plurality of inverters and a first supply voltage; and
   NMOS capacitors coupled between the output terminal of each of the plurality of inverters and a second supply voltage.

6. The delay control circuit of claim 2, wherein the comparator includes:
   an AND gate for performing a logical AND operation on the input signal and the delayed input signal; and
   a transmission gate for transmitting an output signal of the AND gate to a next stage.

7. The delay control circuit of claim 1, wherein the first pulse generator includes:
   a delay circuit for delaying the input signal by the delay time; and
   an AND gate for performing a logical AND operation on the input signal and the delayed input signal.

8. The delay control circuit of claim 1, wherein the counter control circuit includes:
   an inverter for inverting the first signal;
   a first AND gate for performing a logical AND operation on the first signal and the second signal; and
   a second AND gate for performing the logical AND operation on the second signal and an output signal of the inverter.

9. The delay control circuit of claim 1, further comprising:
   a second pulse generator for generating the input signal in response to a clock signal and an enable signal.

10. The delay control circuit of claim 9, wherein the second pulse generator includes:
    an AND gate for performing a logical AND operation on the clock signal and the enable signal;
    a pull-up device for pulling up a node to a level of a first supply voltage;
    a pull-down device for pulling down the node to a level of a second supply voltage; and
    a latch circuit for latching a signal of the node.

11. A delay control circuit, comprising:
    a delay circuit configured to generate a plurality of delayed input signals in response to an input signal, each of the delayed input signals having different a delay time;
    a comparing circuit configured to compare the input signal and each of the delayed input signals to generate a plurality of first signals; and
    a converter circuit for converting the plurality of first signals into a plurality of second signals, wherein the comparing circuit includes a plurality of comparators for comparing a pulse signal having the same phase as the input signal and each of the delayed input signals, wherein each of the plurality of comparators includes;
an AND gate for performing a logical AND operation on the first pulse signal and one of the delayed input signals;
a first transmission gate for transmitting an output signal of the AND gate to a next stage;
a first latch circuit for latching an output signal of the first transmission gate;
a second transmission gate for transmitting an output signal of the first latch circuit in response to the first pulse signal and a second pulse signal having a phase opposite the input signal; and
a second latch circuit for latching an output signal of the second transmission gate.

12. The delay control circuit of claim 11, wherein the delay circuit includes a plurality of delay cells connected in a cascade form, wherein the delayed input signals are output from an output node of each of the delay cells.

13. The delay control circuit of claim 12, wherein each of the delay cells includes:
a plurality of inverters connected in a cascade form;
PMOS capacitors coupled between an output terminal of each of the plurality of inverters and a first supply voltage; and
NMOS capacitors coupled between the output terminal of each of the plurality of inverters and a second supply voltage.

14. The delay control circuit of claim 11, wherein the plurality of delayed input signals is comprised of 8 signals.

15. The delay control circuit of claim 14, wherein the converter circuit includes:
a first converter for generating first data in response to a first output signal of the comparing circuit;
a second converter for generating second data in response to a second output signal of the comparing circuit and the first data;
a third converter for generating third data in response to a third output signal of the comparing circuit and the second data;
a fourth converter for generating fourth data in response to a fourth output signal of the comparing circuit and the third data;
a fifth converter for generating fifth data in response to a fifth output signal of the comparing circuit and the fourth data;
a sixth converter for generating sixth data in response to a sixth output signal of the comparing circuit and the fifth data;
a seventh converter for generating seventh data in response to a seventh output signal of the comparing circuit and the sixth data; and
an eighth converter for generating eighth data in response to an eighth output signal of the comparing circuit and the seventh data,
wherein the plurality of first signals comprises the first to eighth output signals of the comparing circuit and the plurality of second signals comprises the first to eighth data.

16. The delay control circuit of claim 15, wherein the first converter sets the second data to a first value when the first data has a second value.

17. The delay control circuit of claim 16, wherein the first converter includes a resistor.

18. The delay control circuit of claim 15, wherein an n-th (n is a positive integer greater than 1 and less than 8) converter passes an n-th output signal of the comparing circuit to generate n-th data in response to (n−1)-th data.

19. The delay control circuit of claim 18, wherein the n-th converter includes:
a transmission gate for transmitting an n-th output signal of the comparing circuit to a first node in response to the (n−1)-th data;
a pull-down transistor for pulling down the first node to a level of a low supply voltage; and
a third latch circuit for latching a signal of the first node.

20. The delay control circuit of claim 19, further comprising:
an inverter for inverting an output signal of the third latch circuit.

21. The delay control circuit of claim 15, wherein the eighth converter sets the eighth data to a second value when the eighth output signal of the comparing circuit has a first value.

22. The delay control circuit of claim 21, wherein the eighth converter includes:
a first transmission gate for transmitting the eighth output signal of the comparing circuit to a first node in response to the seventh data;
a pull-down transistor for pulling down the first node to a level of a low supply voltage in response to the seventh data;
a second transmission gate for transmitting a signal of the first node to a second node in response to the eighth output signal of the comparing circuit;
a pull-up transistor for pulling up the second node to a level of a high supply voltage in response to the eighth output signal of the comparing circuit; and
a fourth latch circuit for latching a signal of the second node.

23. The delay control circuit of claim 22, wherein the eighth converter further includes an inverter for inverting an output signal of the fourth latch circuit.

24. The delay control circuit of claim 11, further comprising:
a pulse generator for generating the input signal in response to a clock signal and an enable signal.

25. A method of controlling a delay of a semiconductor device, comprising:
delaying an input signal by a delay time in response to an output signal;
comparing the input signal and the delayed input signal to generate a first signal;
generating a second signal in response to the input signal;
generating a count-up signal and a count-down signal in response to the first signal and the second signal; and
generating the output signal in response to the count-up signal and the count-down signal to divide the delay time by $2^n$ intervals, wherein n is a positive integer.

26. A method of controlling a delay of a semiconductor device, comprising:
generating a plurality of delayed input signals in response to an input signal, the plurality of delayed input signals having different delay times;
comparing the input signal and the plurality of delayed input signals to generate a plurality of first signals; and
converting the plurality of first signals into a plurality of second signals,
wherein a first signal of the plurality of first signals is converted into a second signal of the plurality of second signals by generating the second signal in response to the first signal and a previously generated second signal.

* * * * *